(12) United States Patent
Baskaran et al.

(10) Patent No.: US 7,449,361 B2
(45) Date of Patent: Nov. 11, 2008

(54) SEMICONDUCTOR SUBSTRATE WITH ISLANDS OF DIAMOND AND RESULTING DEVICES

(75) Inventors: Rajashree Baskaran, Phoenix, AZ (US); Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 11/230,031

(22) Filed: Sep. 19, 2005

(65) Prior Publication Data

US 2007/0066034 A1    Mar. 22, 2007

(51) Int. Cl.
*H01L 21/00* (2006.01)
*H01L 21/44* (2006.01)

(52) U.S. Cl. .................. 438/105; 438/121; 438/122; 438/455; 257/750; 257/E21.144; 257/E23.106

(58) Field of Classification Search ............... 438/455, 438/473, 476, 105, 121, 122; 257/E21.174, 257/E23.106, 706
See application file for complete search history.

(56) References Cited

U.S. PATENT DOCUMENTS

| 5,672,240 | A | * | 9/1997 | Stoner et al. ............... 216/36 |
| 5,907,768 | A | * | 5/1999 | Malta et al. ................ 438/105 |
| 6,830,813 | B2 | | 12/2004 | Ravi | |

* cited by examiner

*Primary Examiner*—Michael S Lebentritt

(57) ABSTRACT

Disclosed is a method of forming a substrate having islands of diamond (or other material, such as diamond-like carbon), as well as integrated circuit devices formed from such a substrate. A diamond island can form part of the thermal solution for an integrated circuit formed on the substrate, and the diamond island can also provide part of a stress engineering solution to improve performance of the integrated circuit. Other embodiments are described and claimed.

8 Claims, 7 Drawing Sheets

SEMICONDUCTOR SUBSTRATE WITH ISLANDS OF DIAMOND AND RESULTING DEVICES

FIELD OF THE INVENTION

The disclosed embodiments relate generally to the fabrication of integrated circuit devices and, more particularly, to a semiconductor substrate having islands of diamond, as well as devices made from such a substrate.

BACKGROUND OF THE INVENTION

As the performance and functionality of integrated circuit devices improves with each design generation, semiconductor device manufacturers are facing a corresponding increase in power consumption of these devices. Thus, future generations of integrated circuit devices may place greater demands upon the cooling solution. For example, high performance integrated circuit devices, including multi-core architectures, may require thermal solutions that are in closer proximity to the active circuitry and that provide greater heat dissipation. However, while addressing the needs for thermal solutions in future devices, semiconductor manufacturers may also be seeking a variety of performance improvements, such as stress engineering to improve transistor performance.

DETAILED DESCRIPTION OF THE INVENTION

Figure 1:
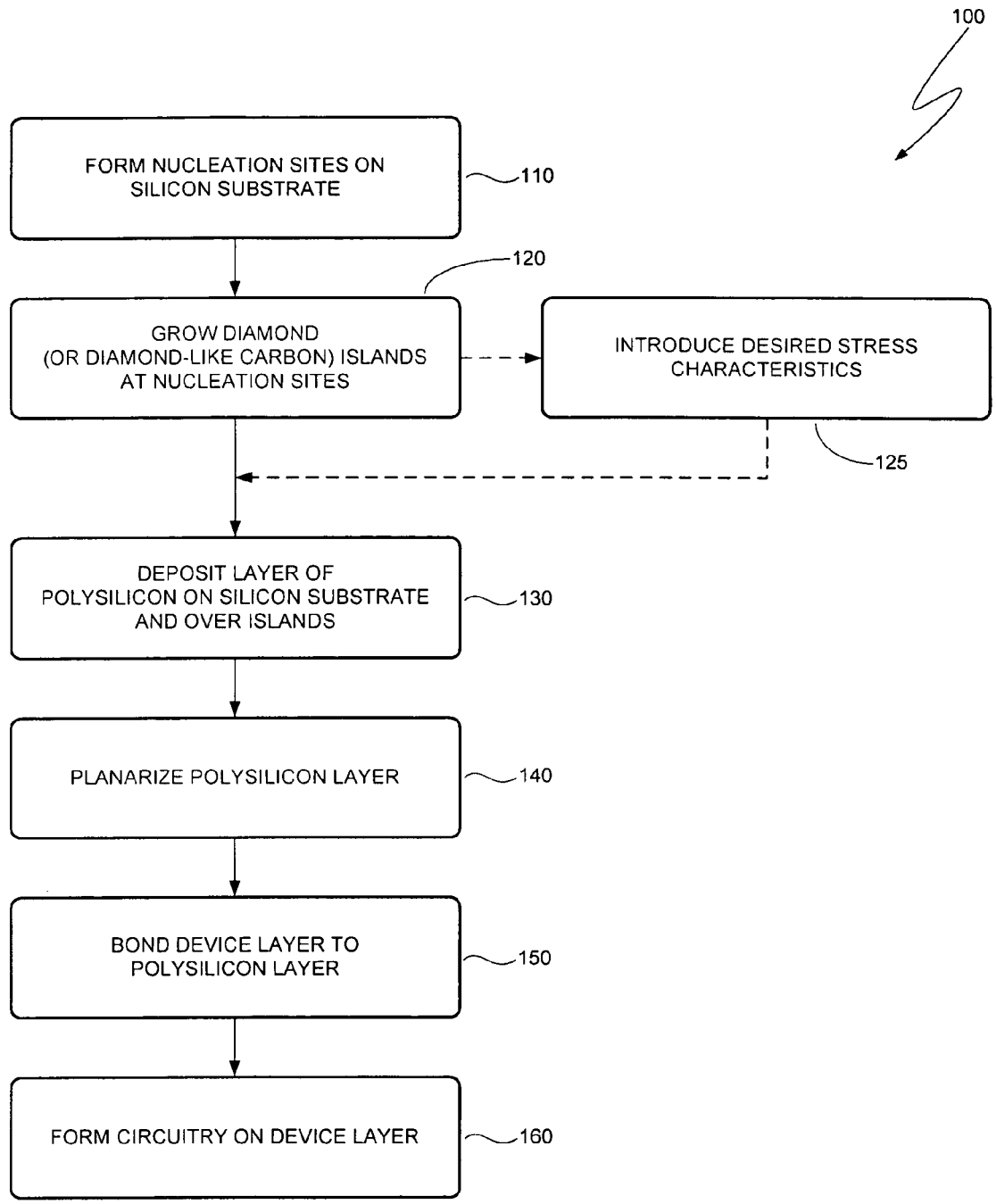
FIG. 1 is a schematic diagram illustrating an embodiment of a method of fabricating a substrate having islands of diamond.

Turning now to FIG. 1, illustrated is an embodiment of a method 100 of fabricating a substrate having islands of diamond. Embodiments of the method 100 shown in FIG. 1 are further illustrated in the schematic diagrams of FIGS. 2A through 2F, and reference should be made to these figures as called out in the text below. Also, it should be noted that, although the embodiments are generally described below in the context of forming islands of diamond on a substrate, the disclosed embodiments are applicable to the formation of islands of other materials, such as diamond-like carbon.

Figure 2A:
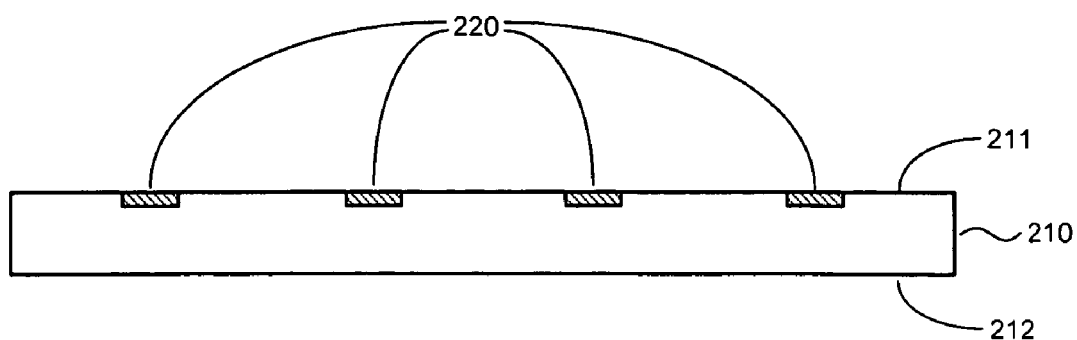
FIGS. 2A-2F are schematic diagram illustrating embodiments of the method shown in FIG. 1.

Referring to block 110 in FIG. 1, a number of nucleation sites are formed on a substrate comprised of silicon. This is illustrated in FIG. 2A, which shows a substrate 210. The substrate 210 may be viewed as having a first side 211 and an opposing second side 212. It should be understood, however, that the labels "first side" and "second side" are arbitrary and, further, that the various surfaces of the substrate 210 may be referenced by any suitable convention. In one embodiment, as noted above, the substrate 210 is comprised of silicon. However, it should be understood that the disclosed embodiments are not limited to silicon substrates and, further, that substrate 210 may comprise other materials (e.g., gallium arsenide).

With continued reference to FIG. 2A, a number of nucleation sites 220 has been formed on the first side 211 of the substrate 210. Generally, a nucleation site 220 comprises any region on the substrate 210 at which a quantity of diamond can be grown or deposited. It should be understood, however, that a nucleation site may comprise a region from which a quantity of another material—e.g., diamond-like carbon—may be grown or otherwise deposited.

In one embodiment, the nucleation sites 220 are formed by abrading the substrate's first side 211 with a diamond powder, leaving small particles of diamond (e.g., <0.25 µm) embedded in the substrate surface. A pattern and etching process is then performed to remove a sufficient thickness of the substrate surface (e.g., a thickness sufficient to remove the embedded diamond particles, which in one embodiment may be approximately 100 to 1,000 Angstroms), except in those regions where nucleation sites 220 are desired. According to a second embodiment, the nucleation sites 220 are formed by mixing diamond particles with a photoresist solution, which is then deposited (e.g., by a spin-on process) onto the substrate's first surface 211. The photoresist is then patterned and etched to form pads of photoresist loaded with diamond particles. During growth of diamond from these loaded photoresist pads, the photoresist may burn off. It should be understood that these are but a few examples of the manner in which nucleation sites 220 may be formed and, further, that other methods of producing nucleation sites for diamond growth (or growth of another material, such as diamond-like carbon) may be utilized.

Figure 2B:
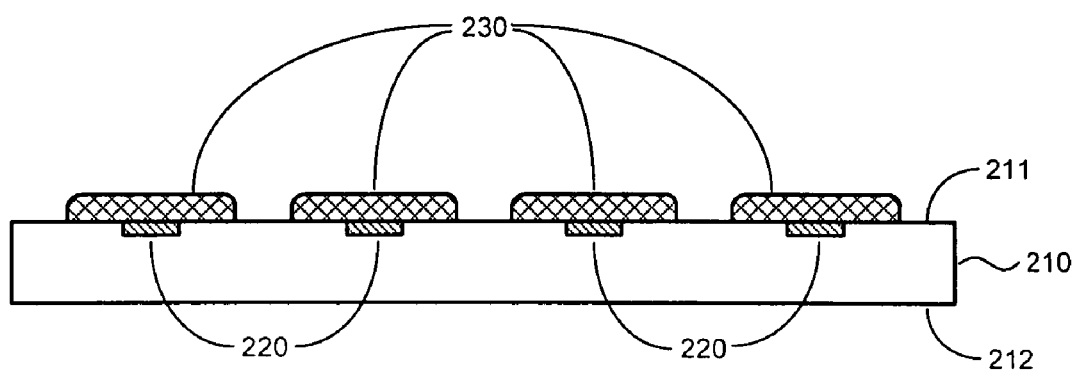

Referring to block 120 in FIG. 1, diamond islands are grown at the nucleation sites. This is illustrated in FIG. 2B, which shows diamond islands 230 that have been formed at nucleation sites 220. Diamond islands 230 may have any suitable shape and may be formed to any suitable thickness. In one embodiment, the diamond islands 230 have a thickness up to 30 µm. Also, any suitable process may be used to form the islands of diamond. According to one embodiment, the diamond islands are grown by a plasma-enhanced chemical vapor deposition (PECVD) process. Plasma generation may be accomplished using a microwave source, an RF source, DC arc discharge, or a hot filament, and may be achieved at a power ranging from 1 kW up to 100 kW. During diamond growth, a mixture of hydrogen and a hydrocarbon (e.g., methane) at a concentration of between 0.5% and 5% may be introduced into the process chamber at a pressure of between 5 and 100 Torr and a temperature of between 600 and 1,100 degrees Celsius. As the reader will appreciate, other chemistries and process conditions may be employed, as desired. Also, it should be understood that diamond islands may be fabricated by processes other than PECVD and, further, that other alternative processes may be used to form islands of material other than diamond (e.g., diamond-like carbon, which may be formed by an ion-beam deposition technique or a CVD process).

As set forth in block 125, according to one embodiment, desired stress characteristics are introduced into the substrate. Introducing stress into the substrate 210 (and a device layer that is to be attached to the substrate, as described below) can improve the performance of NMOS and PMOS devices. In one embodiment, a device layer attached to substrate 210 is in tension (at least in some of those regions of the device layer where active devices are formed), and these tensile stresses may range from 0.5 GPa to 2 GPa.

The stress introduced into the substrate 210 (and a subsequently attached device layer) may be a function of a number of parameters, including the intrinsic stresses present in the substrate and device layer, the thickness of the diamond islands, and the CTE mismatch between the diamond islands (or other island material) and the surrounding silicon (or other substrate material). Any one or combination of these parameters may be utilized to introduce the desired stresses. A number of factors may impact these parameters, including the diamond growth conditions, the microstructure and grain size of the diamond, any pre-stresses that have been introduced (e.g., as may be achieved by bending the substrate), as well as the magnitude of the CTE mismatch. Diamond growth conditions which may be controlled include the gas chemistry (e.g., the ratio of hydrocarbon to hydrogen), the temperature, and the pressure.

Figure 2C:
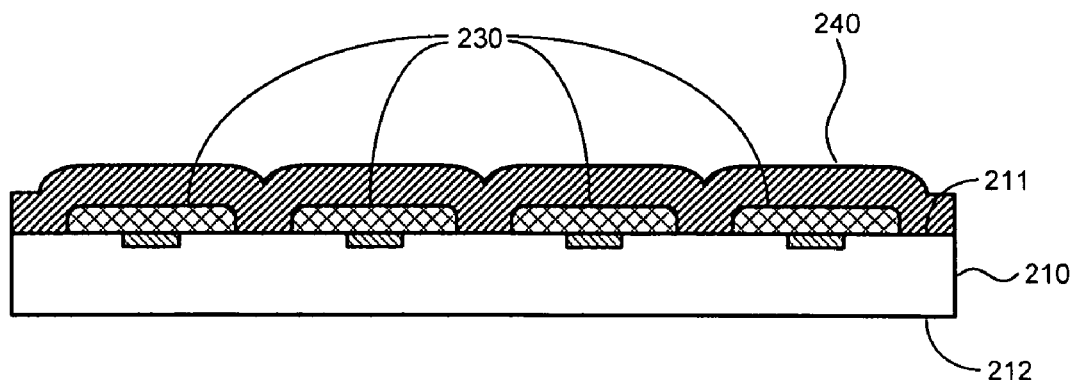

Referring to block 130 in FIG. 1, a layer of polysilicon is deposited over the substrate and the diamond islands. This is illustrated in FIG. 2C, where a layer of polysilicon 240 has been deposited over the substrate's first surface 211 and over the diamond islands 230. The polysilicon layer 240 may be deposited using any suitable blanket deposition technique, such as CVD. Also, it should be understood that the material layer 240 may comprise any other suitable material, depending upon the composition of substrate 210 (and the device layer that is to be attached to the substrate).

Figure 2D:
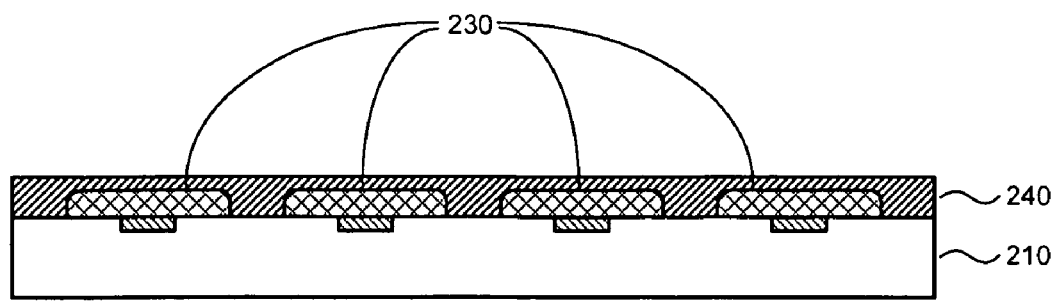

As set forth in block 140, the polysilicon layer is planarized. This is illustrated in FIG. 2D, where the polysilicon layer 240 has been planarized. In one embodiment, the polysilicon layer 240 is planarized to enable subsequent bonding of a device layer to the substrate. The upper surface of the planarized polysilicon layer 240 may provide a relatively smooth surface (in comparison to the surfaces of the diamond islands, which may have relatively rough surfaces) to which the device layer can be bonded. Any suitable process may be employed to planarize the polysilicon layer 240, and in one embodiment a chemical-mechanical polishing (CMP) process is employed. In one embodiment, the thickness of the polysilicon layer above the diamond islands that remains after planarization is between approximately 2 µm and 30 µm.

Figure 2E:
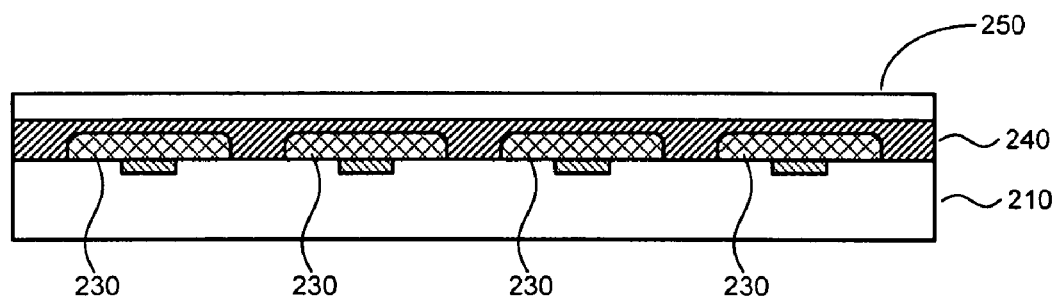

Referring now to block 150 in FIG. 1, a device layer is bonded to the substrate. This is illustrated in FIG. 2E, where a device layer 250 has been bonded to the upper surface of the polysilicon layer 240. The device layer 250 may comprise any suitable material upon which circuitry may be formed. According to one embodiment, the device layer 250 comprises silicon (e.g., where substrate 210 also comprises silicon and material layer 240 comprises polysilicon). However, the device layer 250 may comprise any other suitable material or combination of materials (e.g., GaAs, silicon-on-insulator or SOI, etc.). According to one embodiment, the device layer 250 has a thickness up to 10 µm.

The device layer 250 may be attached to the substrate 210 using any suitable process. In one embodiment, the device layer 250 is bonded to the underlying polysilicon layer using a diffusion bonding technique (e.g., as may be achieved by placing the device layer 250 and substrate 210 together at elevated temperature for a time sufficient to form a diffusion bond between these two substrates). Also, in a further embodiment, a layer transfer process may be employed, wherein hydrogen is introduced into a silicon layer to form voids, and after bonding the silicon layer is cleaved at the void region to leave behind a thin film.

In one embodiment, as described above, stresses are introduced into the substrate 210, and through the bonding process, these stresses are also imparted to the device layer 250. Thus, active circuitry that is to be formed in the device layer can benefit from the improved performance that may be gained by having the device layer under stress (e.g., tensile stress, which can improve the performance of NMOS and PMOS devices). Also, it should be noted that, although the substrate 210 and device layer 250 are under stress, warpage of the substrate and bonded device layer may be minimized due to the discontinuous nature of the diamond islands 230 (e.g., as compared to a substrate having a continuous diamond layer).

Figure 2F:
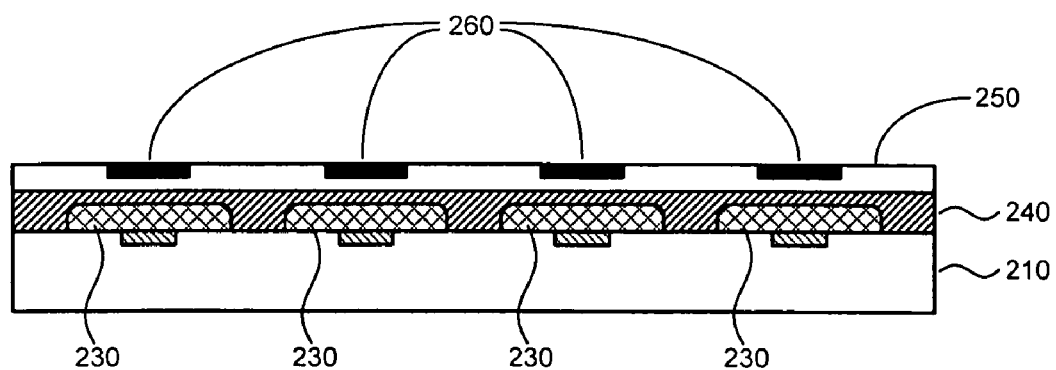

As set forth in block 160, circuitry may then be formed on the device layer. This is illustrated in FIG. 2F, where circuitry 260 has been formed on the device layer 250. Circuitry 260 may include any suitable collection of circuit elements, including transistors, capacitors, resistors, diodes, inductors, etc. In one embodiment, circuitry 260 comprises a number of processor cores, with at least one processor core overlying each of the diamond islands 230. According to a further embodiment, multiple processor cores overly each of the diamond islands.

Also, although not shown in any of FIG. 2F, an interconnect structure may be formed over the device layer 250 (and over the active circuitry 260 on this layer). This interconnect structure may include a number of levels of metallization, each level of metallization comprising a layer of dielectric material in which a number of conductors (e.g., traces) has been formed. The conductors in any given level of metallization are separated from the conductors of adjacent levels by the dielectric material, and the conductors of adjacent levels are electrically interconnected by conductive vias extending between these levels. The conductors and vias may comprise any suitable conductive material, such as copper, aluminum, gold, silver, or alloys of these and other metals. The dielectric material may comprise any suitable dielectric or insulating material, such as silicon dioxide ($SiO_2$), SiOF, carbon-doped oxide (CDO), a glass, or a polymer material.

Figure 3:
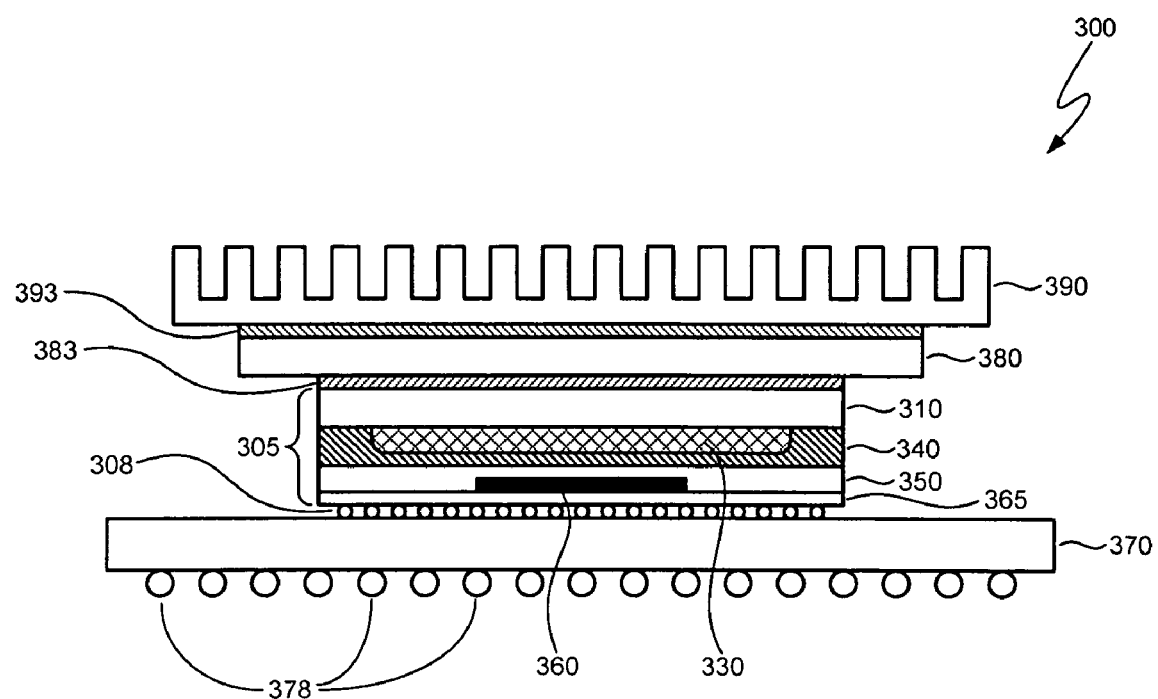
FIG. 3 is a schematic diagram illustrating an embodiment of an integrated circuit device including a die having one or more islands of diamond.

Referring to FIG. 3, illustrated is an embodiment of an integrated circuit (IC) device 300. The IC device 300 includes a die 305 coupled with a substrate 370. Any suitable interconnects (e.g., solder bumps 308, or other suitable interconnects) may be used to couple the die 305 to substrate 370, and the substrate 370 may also include a plurality of interconnects (e.g., solder bumps 378 or other suitable interconnects) to couple the IC device with a next level component (e.g., a circuit board, a mother board, a server blade, another IC device, etc.). A heat spreader 380 (or integrated heat spreader and lid) is attached to an opposing side of the die 305, and a heat sink 390 may be coupled with the heat spreader. Each of the heat spreader 380 and heat sink 390 may be constructed of any suitable thermally conductive material (e.g., copper). A first layer of thermal interface material (TIM) 383 may be disposed between the die 305 and heat spreader 380, and a second TIM layer 393 may be disposed between the heat spreader and heat sink 390. The first and second TIM layers 383, 393 may comprise any suitable thermally conductive material, such as a solder, a conductive epoxy, and conductive composite material, etc.

In one embodiment, the die 305 is formed according to any of the embodiments disclosed herein. The die 305 may include a base layer 310 comprised of silicon (or other suitable material) upon which one or more diamond islands 330 (or islands of other material, such as diamond-like carbon) has been formed. A layer of polysilicon 340 (or other suitable material) is also disposed on base layer 310 and over diamond island 330. A device layer 350 comprised of silicon (or other suitable material), has been disposed over polysilicon layer, and a processor core 360 (or other circuitry) is formed in the device layer. An interconnect structure 365 is formed on the device layer 350 and over the processor core 360.

Figure 4A:
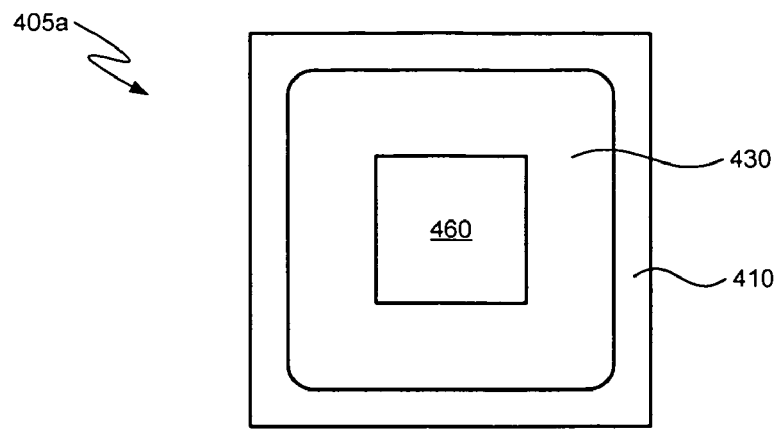
FIGS. 4A-4C are schematic diagrams, each illustrating an embodiment of an integrated circuit die including one or more islands of diamond.
Figure 4B:
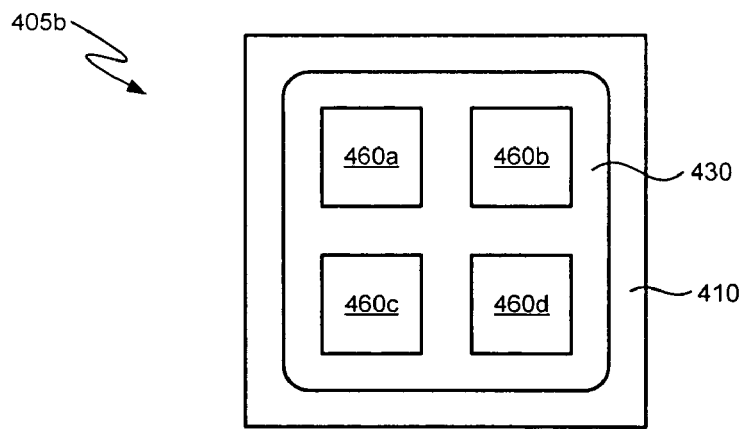
Figure 4C:
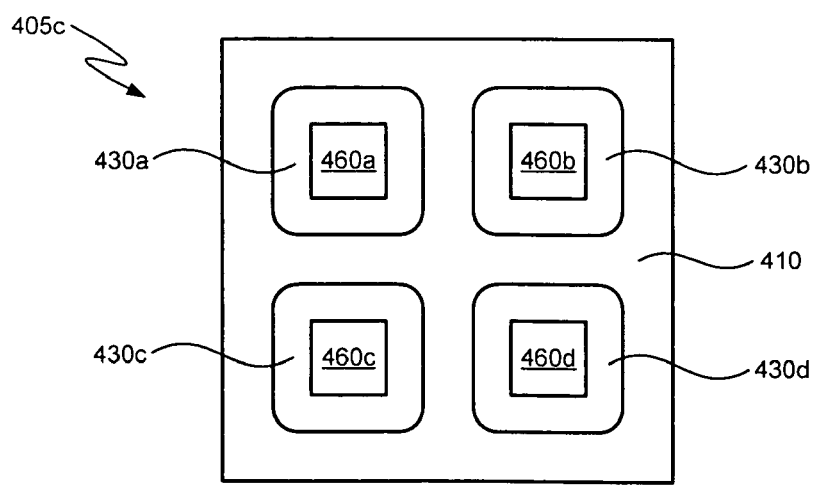

As shown in FIG. 3, the die 305 includes a single diamond island 330 and a single processor core 360. Such an embodiment is further illustrated schematically in FIG. 4A, which shows a die 405a including a base layer 410. Disposed on the base layer 410 is a single diamond island 430, and disposed over this diamond island (in a device layer, which is not shown in this figure) is a single processor core 460. However, the disclosed embodiments are not limited to a single diamond island-single processor core architecture. For example, as shown in FIG. 4B, a die 405b includes a single diamond island 430 disposed over a base layer 410; however, four processor cores 460a-d are disposed over this diamond island (in a device layer not shown in this figure). By way of further example, as shown in FIG. 4C, a die 405c includes four diamond islands 430a-d disposed on a base layer 410, and a single processor core, is disposed over each of these diamond islands (e.g., processor core 460a is disposed over island 430a, and so on). Thus, it should be understood that any combination of diamond islands and processor cores may be disposed on a single die, as desired. Also, according to one embodiment, the area of the diamond island (or islands) is approximately two times the area of the processor core (or cores), although any suitable ratio of the size of the diamond island to the size of the core may be employed.

Figure 5:
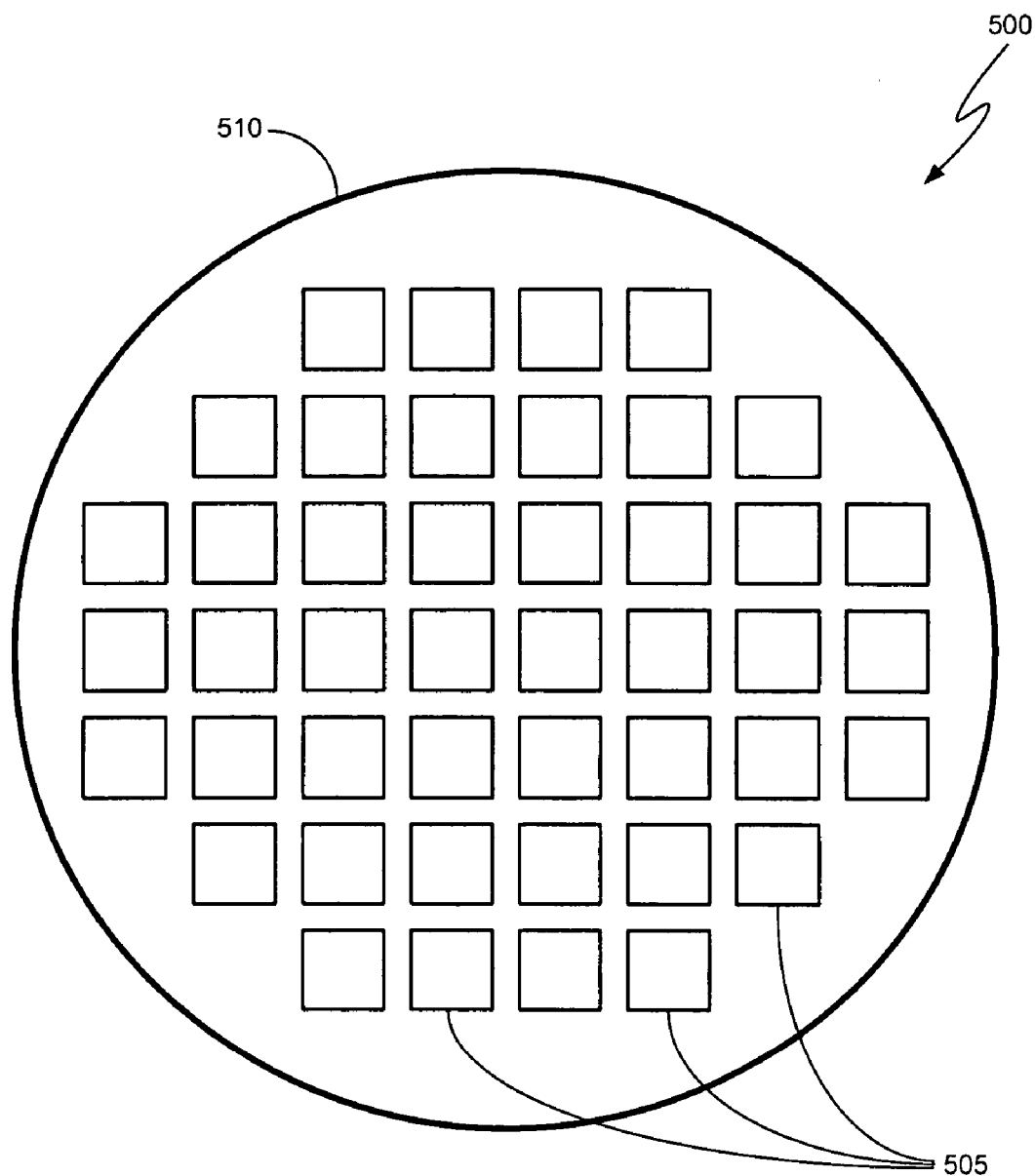
FIG. 5 is a schematic diagram illustrating an embodiment of a wafer which may be formed according to the disclosed embodiments.

Although the substrate 210 shown in FIGS. 2A through 2F includes a limited number of diamond islands 230 (and circuitry 260) for ease of illustration, it should be understood that the disclosed embodiments are typically performed at the wafer level and that such a wafer may include integrated circuitry for a number of die. This is further illustrated in FIG. 5 which shows a plan view of a wafer 500. Referring to this figure, the wafer 500 comprises a substrate 510 upon which integrated circuitry for a number of die 505 has been formed, and wafer 500 is ultimately cut into these separate die 505. According to one embodiment, the substrate 510 includes a number of diamond islands formed thereon, as described above. In practice, each of the die 505 may include one or more diamond islands, and the wafer 500 as a whole may include hundreds, or perhaps thousands, of these structures. Further, each die 505 may include hundreds of millions of circuit elements (e.g., transistors, etc.).

Figure 6:
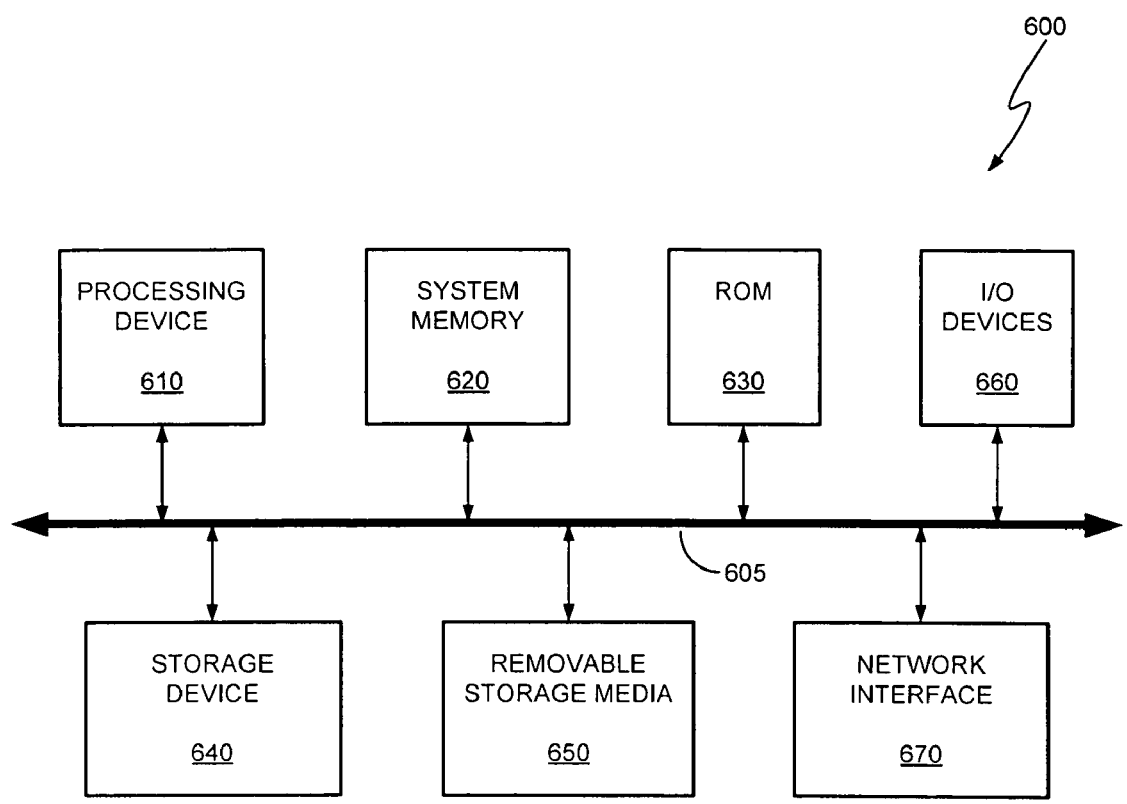
FIG. 6 is a schematic diagram illustrating an embodiment of a computer system, which may include a component formed according to the disclosed embodiments.

Referring to FIG. 6, illustrated is an embodiment of a computer system 600. Computer system 600 includes a bus 605 to which various components are coupled. Bus 605 is intended to represent a collection of one or more buses—e.g., a system bus, a Peripheral Component Interface (PCI) bus, a Small Computer System Interface (SCSI) bus, etc.—that interconnect the components of system 600. Representation of these buses as a single bus 605 is provided for ease of understanding, and it should be understood that the system 600 is not so limited. Those of ordinary skill in the art will appreciate that the computer system 600 may have any suitable bus architecture and may include any number and combination of buses.

Coupled with bus 605 is a processing device (or devices) 610. The processing device 610 may comprise any suitable processing device or system, including a microprocessor, a network processor, an application specific integrated circuit (ASIC), or a field programmable gate array (FPGA), or similar device. It should be understood that, although FIG. 6 shows a single processing device 610, the computer system 600 may include two or more processing devices.

Computer system 600 also includes system memory 620 coupled with bus 605, the system memory 620 comprising, for example, any suitable type and number of memories, such as static random access memory (SRAM), dynamic random access memory (DRAM), synchronous DRAM (SDRAM), or double data rate DRAM (DDRDRAM). During operation of computer system 600, an operating system and other applications may be resident in the system memory 620.

The computer system 600 may further include a read-only memory (ROM) 630 coupled with the bus 605. The ROM 630 may store instructions for processing device 610. The system 600 may also include a storage device (or devices) 640 coupled with the bus 605. The storage device 640 comprises any suitable non-volatile memory, such as, for example, a hard disk drive. The operating system and other programs may be stored in the storage device 640. Further, a device 650 for accessing removable storage media (e.g., a floppy disk drive or a CD ROM drive) may be coupled with bus 1005.

The computer system 600 may also include one or more I/O (Input/Output) devices 660 coupled with the bus 605. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 600.

The computer system 600 may further comprise a network interface 670 coupled with bus 605. The network interface 670 comprises any suitable hardware, software, or combination of hardware and software that is capable of coupling the system 600 with a network (e.g., a network interface card). The network interface 670 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 600 illustrated in FIG. 6 is intended to represent an exemplary embodiment of such a system and, further, that this system may include many additional components, which have been omitted for clarity and ease of understanding. By way of example, the system 600 may include a DMA (direct memory access) controller, a chip set associated with the processing device 610, additional memory (e.g., a cache memory), as well as additional signal lines and buses. Also, it should be understood that the computer system 600 may not include all of the components shown in FIG. 6. The computer system 600 may comprise any type of computing device, such as a desktop computer, a laptop computer, a server, a hand-held computing device (e.g., a personal digital assistant, or PDA), a wireless communication device, an entertainment system, etc.

In one embodiment, the computer system 600 includes a component constructed according to any of the embodiments disclosed above. For example, the processing device 610 of system 600 may include a die having diamond islands. However, it should be understood that other components of system 600 (e.g., network interface 670, etc.) may include a device formed according to any of the disclosed embodiments.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming a number of nucleation sites on a substrate;
   forming an island of diamond or diamond-like carbon at each of the nucleation sites;
   depositing a layer of a material over the substrate and the number of islands;
   planarizing the material layer;
   bonding a device layer to the material layer; and
   introducing stress into the device layer, wherein the stress comprises tensile stresses in a range of between 0.5 GPa and 2 GPa.

2. The method of claim 1, further comprising forming circuitry on the device layer, at least some of the circuitry overlying one of the islands.

3. A method comprising:
   forming a number of nucleation sites on a substrate, the substrate comprised of silicon;
   forming an island of diamond at each of the nucleation sites;
   depositing a layer of polysilicon over the substrate and the number of diamond islands;
   planarizing the polysilicon layer;
   bonding a device layer comprised of silicon to the polysilicon layer; and
   introducing stress into the device layer, wherein the stress comprises tensile stresses in a range of between 0.5 GPa and 2 GPa.

4. The method of claim 3, further comprising forming a number of processor cores on the device layer, each of the processor cores overlying one of the diamond islands.

5. The method of claim 4, wherein two or more of the processor cores overlie at least one of the diamond islands.

6. The method of claim 3, wherein forming the nucleation sites comprises:
   embedding particles of diamond in a surface of the substrate; and
   removing portions of the substrate surface, leaving behinds regions of the substrate surface having the embedded diamond particles to form the nucleation sites.

7. The method of claim 3, wherein forming the nucleation sites comprises:
   depositing a layer of a photoresist material onto a surface of the substrate, the photoresist material including diamond particles; and
   removing a portion of the photoresist layer, leaving behind regions of the photoresist material having the diamond particles to form the nucleation sites.

8. The method of claim 3, wherein bonding the device layer to the substrate comprises forming a diffusion bond between the device layer and the polysilicon layer.

* * * * *